(12) United States Patent
Kajita

(10) Patent No.: US 7,633,286 B2
(45) Date of Patent: Dec. 15, 2009

(54) ELECTRIC CURRENT MONITORING DEVICE

(75) Inventor: Tetsuya Kajita, Tokyo (JP)

(73) Assignee: Yamatake Corporation, Tokyo (JP)

(*) Notice: Subject to any disclaimer, the term of this patent is extended or adjusted under 35 U.S.C. 154(b) by 109 days.

(21) Appl. No.: 12/064,938

(22) PCT Filed: Aug. 9, 2006

(86) PCT No.: PCT/JP2006/315757

§ 371 (c)(1),
(2), (4) Date: Feb. 26, 2008

(87) PCT Pub. No.: WO2007/026519

PCT Pub. Date: Mar. 8, 2007

(65) Prior Publication Data

US 2009/0243564 A1 Oct. 1, 2009

(30) Foreign Application Priority Data

Aug. 31, 2005 (JP) .............................. 2005-251912

(51) Int. Cl.
*G01R 19/22* (2006.01)
(52) U.S. Cl. ..................................................... 324/120
(58) Field of Classification Search ................... None
See application file for complete search history.

(56) References Cited

U.S. PATENT DOCUMENTS

| | | | | |
|---|---|---|---|---|
| 1,729,320 A | * | 9/1929 | Anderson | ................ 324/99 R |
| 5,146,156 A | * | 9/1992 | Marcel | ...................... 324/127 |
| 5,742,225 A | | 4/1998 | Wetzel et al. | |
| 7,256,574 B2 | * | 8/2007 | Teulings et al. | ......... 324/117 R |
| 2008/0004819 A1 | * | 1/2008 | Namba et al. | ............... 324/647 |

FOREIGN PATENT DOCUMENTS

| | | |
|---|---|---|
| CN | 1512642 A | 7/2004 |
| JP | 05-083170 A | 4/1993 |
| JP | 06-132858 A | 5/1994 |
| JP | 08-329380 A | 12/1996 |
| JP | 09-081883 A | 3/1997 |
| JP | 2004-021877 A | 1/2004 |

OTHER PUBLICATIONS

Chinese Office Action dated Jan. 16, 2009 (4 pages), and English translation thereof (5 pages) issued in counterpart Chinese Application No. 200680030995X.

* cited by examiner

*Primary Examiner*—Jermele M Hollington
(74) *Attorney, Agent, or Firm*—Frishauf, Holtz, Goodman & Chick, P.C.

(57) ABSTRACT

An electric current monitoring device is provided to be used in conjunction with a measuring instrument that converts a physical quantity measured thereby to a signal current and outputs the signal current to a two-wire transmission line. The electric current monitoring device includes an electric current detector inserted in the transmission line for measuring an electric current value of the signal current outputted to the transmission line, and a supply voltage generator inserted in the transmission line for outputting a voltage generated due to the flow of the signal current. The electric current detector is driven by the voltage outputted from the supply voltage generator.

2 Claims, 12 Drawing Sheets

ELECTRIC CURRENT MONITORING DEVICE

This application is a U.S. National Phase Application under 35 USC 371 of International Application PCT/JP2006/315757 filed Aug. 9, 2006.

TECHNICAL FIELD

The present invention relates to electric current monitoring devices, and more particularly, to an electric current monitoring device for monitoring an electric current flowing through a two-wire transmission line for industrial use.

BACKGROUND ART

Conventionally, in a chemical plant or petrochemical plant comprising multiple equipments and apparatuses disposed on a vast site, industrial measuring instrumentation is applied for measuring physical quantities such as the pressures and temperatures in the equipments and apparatuses and the flow rates of fluids flowing through pipes, in order to control the plant. An industrial measuring instrument used in such applications is shown in FIG. 12, by way of example. The industrial measuring instrument 1 is connected to a two-wire transmission line 2 in series with a direct-current power supply 3 (e.g., 24 V) and a load resistor 4 (e.g., 250Ω), and sends the physical quantity measured thereby to the transmission line 2 after converting the measured quantity to an electric current value falling within a range of 4 mA to 20 mA.

In plants, an electric current loop circuit as shown in the figure is generally employed in which the physical quantity measured by the industrial measuring instrument 1 is converted to an electric current value within a predetermined range and then transmitted. This is because, in the case of plants, a transmission cable with a large length is used and thus, if the measured quantity is transmitted by means of voltage amplitude, the transmission itself is likely to fail due to signal degradation attributable to the electrical resistance of the cable.

In the electric current loop circuit, the industrial measuring instrument generally outputs an electric current proportional to the measured physical quantity within the range of 4 mA to 20 mA, wherein 20 mA represents a 100% physical quantity that the measuring instrument can measure and 4 mA represents a 0% physical quantity. The load resistor has a resistance of 250Ω because voltage drops of 1 V and 5 V occur when 4 mA and 20 mA currents flow through the resistor, respectively, and the voltage range of 1 V to 5 V is convenient for various control actions and computations.

As industrial measuring instruments of this type, a two-wire transmitter disclosed in Unexamined Japanese Patent Publication No. H09-81883, for example, is known in which an industrial measuring instrument (hereinafter merely referred to as measuring instrument where appropriate) itself generates operating power by using the electric current flowing through a two-wire transmission line, thus making it unnecessary to use a power supply unit and a power supply line for operating the measuring instrument, or to use a battery. This two-wire transmitter generates operating power therein by using the electric current flowing through the two-wire transmission line and outputs, to the two-wire transmission line, an electric current corresponding to the physical quantity measured by the measuring instrument.

The physical quantities measured by individual measuring instruments are supplied through the respective two-wire transmission lines to a centralized control device for controlling the plant, for example. The centralized control device performs various processes, such as corrections and calculations, on the data obtained through the two-wire transmission lines and controls the entire plant on the basis of the processed data. In plants with complex control systems, diverse outputs from different measuring instruments need to be handled. Accordingly, users who operate or monitor plants with such complex control systems are demanding to monitor each of numerous measuring instruments in the plant in order to determine whether the output data of the individual measuring instruments is accurate or not and what trend the output data shows, for purposes of precautions and maintenance.

Also, in cases where the measurement data outputted from the two-wire transmitter is used for purposes other than the control by the centralized control device for controlling the entire plant (e.g., in the case of monitoring the electric currents flowing through the transmission lines), it is sometimes necessary that programs in the control loop or the system be modified. It is, however, difficult to extract data of the individual measuring instruments, out from the programs used in the existing control system, to be reused for monitoring, especially in cases where the measurement system is large in scale and complicated. In some plants, therefore, measures are taken as an effective means such that data outputted from the individual measuring instruments is collected through separate lines for monitoring, independent of the transmission lines (two-wire transmission lines) used for control purposes. Generally, the value measured by an electric current monitoring device is sent through a transmission line (wired transmission path, e.g., GPIB) laid separately from the two-wire transmission line.

The electric current monitoring device may alternatively be configured to transmit the measured value over a radio transmission path, as shown in FIG. 13, for example, instead of the wired transmission path. With this method, the electric current monitoring device measures the electric current flowing through the two-wire transmission line, and the measurement data is radio-transmitted by a wireless monitoring device 5. The wireless monitoring device 5 is provided with a battery 6, for example, as a power supply for operating the device 5. This type of industrial measuring instrument with a battery-driven electric current monitoring device using a radio transmission scheme is also commonly known in the art.

In order to transmit the electric current value measured by the electric current monitoring device, however, it is necessary that a transmission line be laid separately from the line used for control purposes, requiring a transmission line with a substantially large length. Further, where the electric current monitoring device requires a power supply, a power supply line needs to be extended to the electric current monitoring device over a distance almost equal to the length of the transmission line. Thus, if the electric current monitoring device is distant from the centralized control device, that is, if the power supply line needs to be extended over a long distance, costs increase considerably.

The power supply line can be omitted if the electric current monitoring device is driven by a battery. Also, if the electric current monitoring device is configured to transmit the measured electric current data by wireless and to operate on a battery, it is unnecessary to use a power supply line or a transmission line. However, battery has a limited lifetime and must be replaced. Thus, the battery-driven electric current monitoring device requires the labor of replacing the battery. Further, since a large-scale plant usually includes a large number of electric current monitoring devices, much labor is required to locate the battery-driven electric current monitoring devices within the site of the plant. Also, if the batteries of the electric current monitoring devices are replaced with new ones whenever the batteries go dead, the replacement work entails substantial costs. It is therefore preferable that the batteries of the electric current monitoring devices be collectively replaced at regular intervals before the batteries go flat. With this method, however, there is a possibility that the batteries will be replaced at unduly short intervals, and a problem arises in that usable batteries also are discarded, which leads to waste of resources. In the case of the battery-driven electric current monitoring devices, moreover, there are restrictions on locations where the electric monitoring devices are to be arranged, because of their need for battery replacement.

As an alternative, the electric current flowing through each two-wire transmission line may actually be measured by a maintenance person with the use of a digital multimeter or tester. It is necessary, however, to provide a power supply (commercial power supply or battery) for operating the digital multimeter or the like, and a problem also arises in that real-time measurement is not available.

In the two-wire transmitter (hereinafter merely referred to as transmitter) disclosed in the aforementioned patent document, a supply voltage required to drive the transmitter is generated by a shunt regulator using the electric current flowing through the two-wire transmission line, and then the electric current flowing through the transmission line is adjusted to an electric current value corresponding to the value detected by a sensor provided in the transmitter. Thus, although the electric current flowing through the two-wire transmission line is controlled by the transmitter, the transmitter does not detect an actual electric current value of the transmission line. This will be explained in more detail with reference to the circuit diagram of FIG. 1 of the patent document. The electric current flowing through the transmission line is controlled by using the terminal voltage of a feedback resistor R2. Accordingly, even if the electric current flowing through the two-wire transmission line deviates from a desired value due to degradation of resistors (R5, R6, R7, R8, R2) or transistors (Q4, Q2), short circuit, etc., fault of these elements cannot be detected since the electric current flowing through the transmission line is not detected. Namely, when the measuring instrument itself is faulty, the transmitter of the patent document is controlled using the output electric current of the faulty measuring instrument. It is therefore difficult to detect fault of the transmitter itself.

DISCLOSURE OF THE INVENTION

The present invention was made to solve the above problems, and an object thereof is to provide an electric current monitoring device that requires neither an operating power supply nor a transmission line for transmitting an electric current value measured thereby.

To achieve the object, the present invention provides an electric current monitoring device arranged for measuring an electric current value of a signal current outputted to a two-wire transmission line by a measuring instrument that converts a physical quantity measured thereby to the signal current. The electric current monitoring device comprises: an electric current detector inserted in the transmission line, for measuring an electric current value of the signal current outputted to the transmission line; and a supply voltage generator inserted in the transmission line, for outputting a voltage generated due to flow of the signal current, wherein the electric current detector is driven by the voltage outputted from the supply voltage generator.

Preferably, the supply voltage generator includes: a transistor inserted in the transmission line and allowing the signal current to pass therethrough; a voltage detector connected to two electrodes of the transistor, for detecting a voltage value of a voltage generated between the two electrodes due to flow of the signal current therebetween; a reference voltage generator connected to the two electrodes of the transistor, for outputting a predetermined reference voltage value; and a voltage comparator/regulator for comparing the reference voltage value outputted from the reference voltage generator with the voltage value detected by the voltage detector, and varying an internal resistance of the transistor to adjust the voltage between the two electrodes of the transistor to a predetermined voltage value.

The supply voltage generator used in the electric current monitoring device controls the internal resistance of the transistor inserted in the transmission line to cause a voltage drop between the two electrodes of the transistor (in the case of a MOSFET, for example, between the source and the drain). At this time, the electric current flowing through the transmission line remains unchanged. Namely, in the electric current monitoring device of the present invention, although the internal resistance of the transistor is controlled to adjust the voltage drop between the two electrodes (e.g., source and drain) of the transistor to a predetermined voltage, the signal current is allowed to vary depending solely on the electric current value controlled by the measuring instrument. Accordingly, the voltage between the two electrodes of the transistor can be set to a desired value. In the electric current monitoring device of the present invention, the electric current detector is operated by the voltage (voltage drop) generated between the two electrodes of the transistor, to measure the electric current flowing through the transmission line.

Preferably, the electric current monitoring device of the present invention further comprises a radio unit for radio-transmitting the electric current value measured by the electric current detector, and the radio unit is driven by the voltage outputted from the supply voltage generator.

Since the radio unit is driven by the voltage outputted from the supply voltage generator, it is unnecessary to equip the electric current monitoring device with a power supply for operating the radio unit. Further, the electric current monitoring device does not require a transmission line for transmitting the measured electric current value.

Preferably, the radio unit transmits the measured electric current value intermittently at predetermined intervals, and the electric current monitoring device further comprises a capacitive element for storing a charge derived from the supply voltage generator while the transmission of the radio unit is stopped and for releasing the stored charge to make up for an electric current needed by the radio unit while the transmission of the radio unit is being performed.

With this electric current monitoring device, the radio unit is operated intermittently in consideration of the situation where a minimum current (4 mA), for example, is flowing through the two-wire transmission line, which current value is large enough to operate the circuit elements other than the radio unit but becomes deficient if the radio unit is operated to transmit data. When the radio unit is in a standby state and thus is not transmitting data, a surplus charge (electric current) outputted from the supply voltage generator is stored in the capacitive element (capacitor). When the radio unit transmits data, on the other hand, the electric current monitoring device is supplied with electric current from the transmission line and also the charge (electric current) stored in the capacitor is used to operate the radio unit.

Thus, in the electric current monitoring device of the present invention, the supply voltage generator internally generates the voltage for operating the electric current monitoring device by using the electric current flowing through the transmission line. Accordingly, the electric current monitoring device can measure the electric current flowing through the transmission line without using a power supply, such as a battery or power supply line for operating the electric current monitoring device. Also, the measured electric current value is radio-transmitted by means of the radio unit that is operated by the voltage generated from the electric current flowing through the transmission line. Thus, the electric current monitoring device does not require a wired transmission path for transmitting the measured electric current data. Since the electric current monitoring device of the present invention requires neither a power supply line nor a wired transmission path for transmitting the measured electric current value, the cost of laying the power supply line and the wired transmission path can be cut down. It is also unnecessary to replace battery, thus ensuring good maintainability.

In the electric current monitoring device of the present invention, moreover, the radio unit is intermittently operated to transmit data at predetermined intervals. While the data transmission from the radio unit is stopped, a charge (electric current) derived from the supply voltage generator is stored in the capacitor, and when data is transmitted from the radio unit, the charge (electric current) stored in the capacitor is released to make up for the electric current needed by the radio unit. It is therefore possible to use a high-output radio unit in the electric current monitoring device, whereby the measurement data on the electric current flowing through the transmission line can be transmitted over a long distance without using a wired transmission path. The present invention is also advantageous in that the electric current monitoring device can be easily applied to existing plants.

BEST MODE OF CARRYING OUT THE INVENTION

Figure 12:
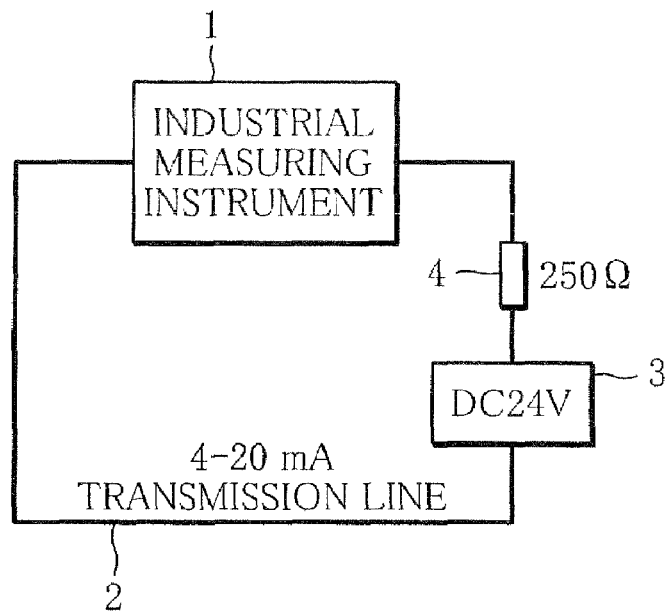
FIG. 12 is a schematic block diagram of a conventional industrial measurement system using a two-wire transmission line.
Figure 13:
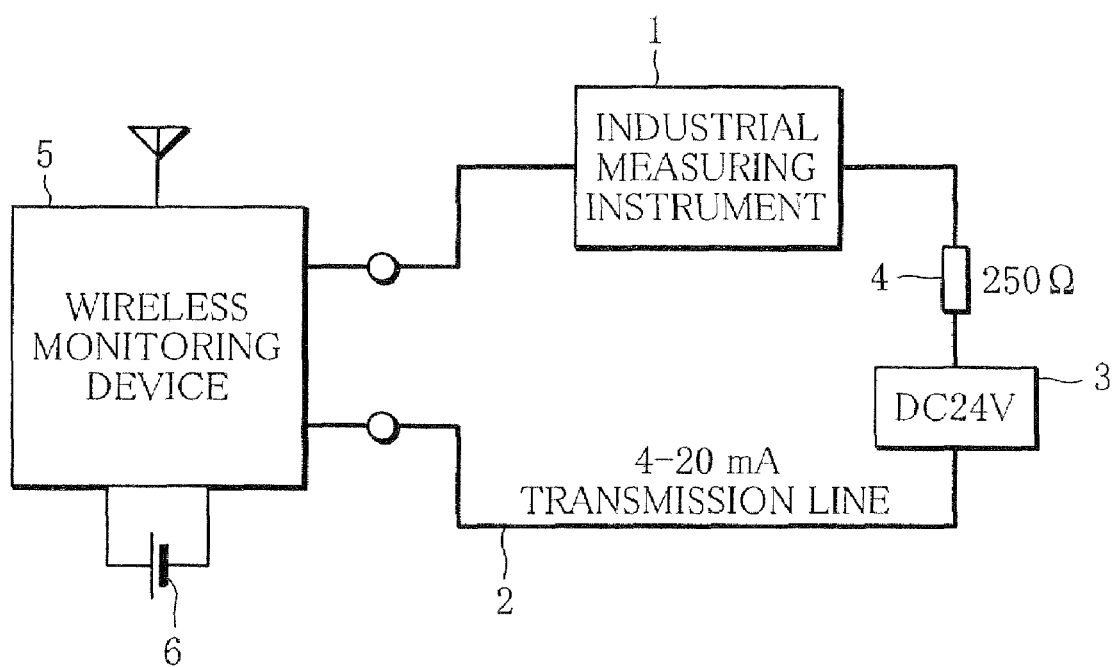
FIG. 13 is a schematic block diagram of the conventional industrial measurement system incorporated with a wireless monitoring device and an electric current monitoring device for measuring the electric current flowing through the two-wire transmission line.

Electric current monitoring devices according to the present invention will be hereinafter described with reference to the accompanying drawings. FIGS. 1 through 10 illustrate preferred embodiments of the present invention by way of example, and the invention is not limited to the illustrated embodiments alone. Also, in the figures, identical reference numerals are used to denote elements identical in basic construction with those in the conventional measurement system with a two-wire transmission line shown in FIGS. 12 and 13, and in the following, such elements will be explained only briefly.

Figure 1:
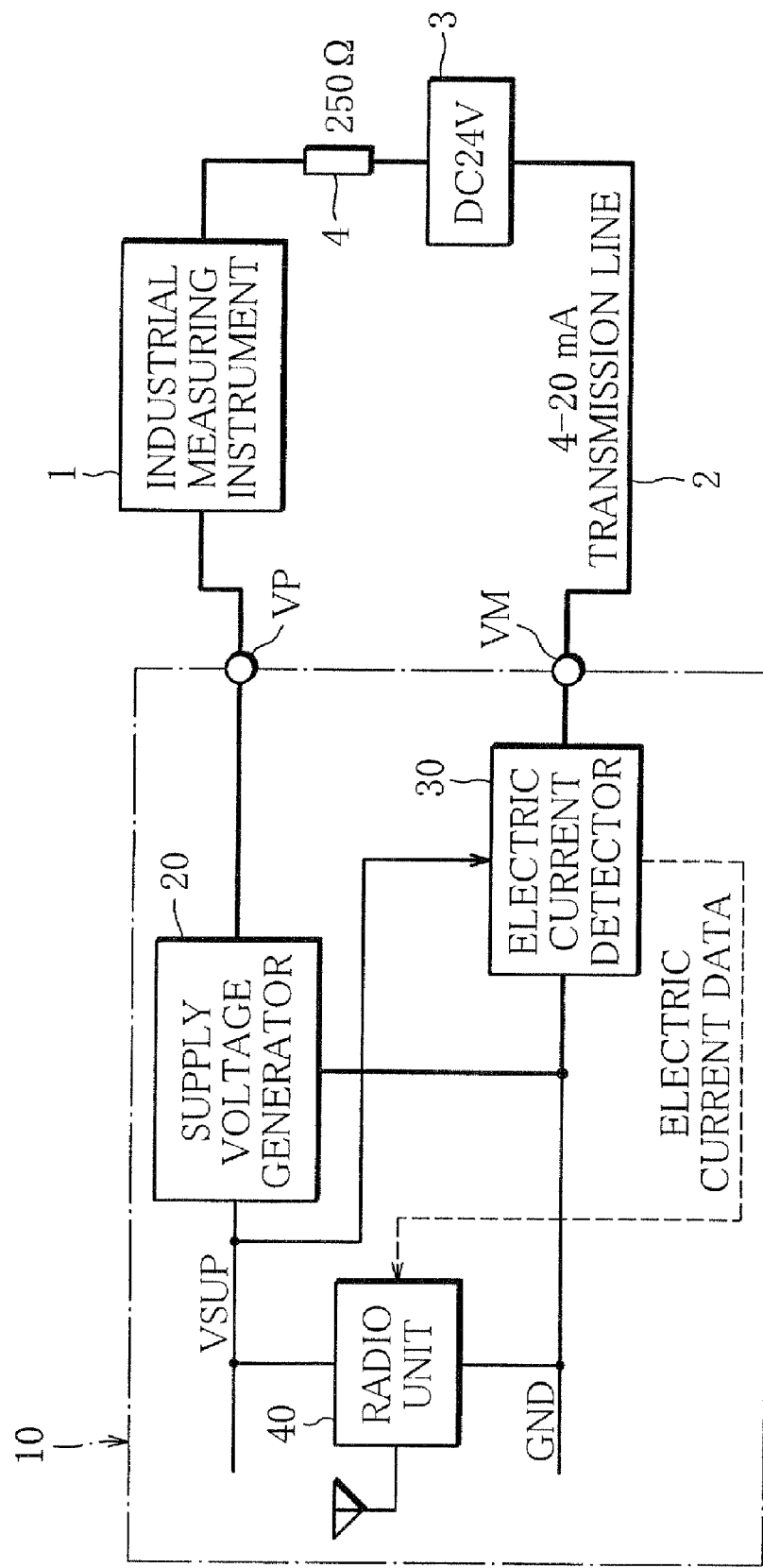
FIG. 1 is a schematic block diagram of an electric current monitoring device according to a first embodiment of the present invention.
Figure 2:
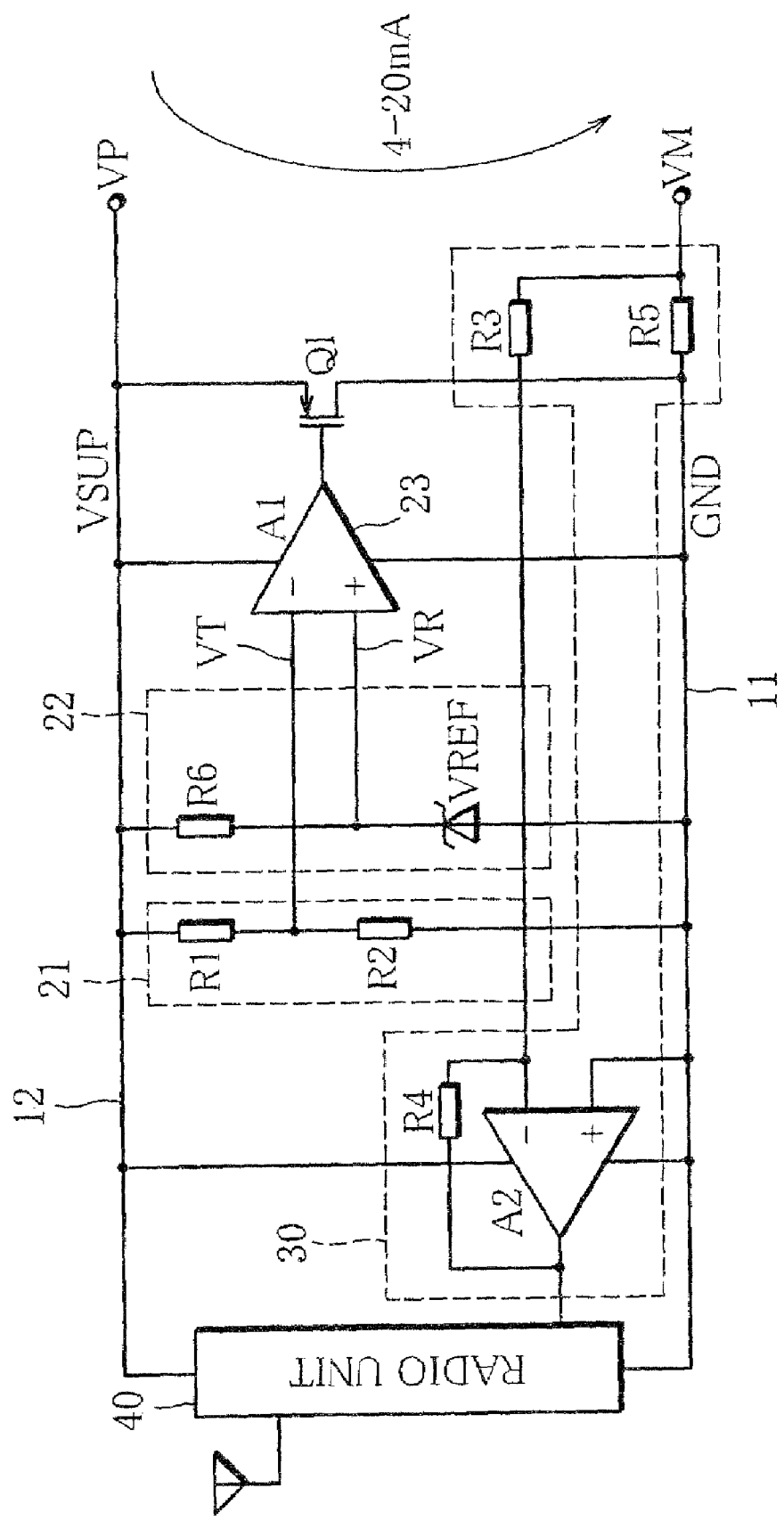
FIG. 2 is a circuit diagram of a principal part of the electric current monitoring device shown in FIG. 1.

FIG. 1 is a schematic block diagram illustrating a first embodiment of the present invention. Reference numeral 1 denotes an industrial measuring instrument (hereinafter merely referred to as measuring instrument where appropriate) which includes any of various sensors (not shown in FIG. 1) for measuring a physical quantity to be measured (e.g., pressure, temperature, fluid flow rate, etc.) and outputs a signal current corresponding to the measured physical quantity to a two-wire transmission line 2 (hereinafter merely referred to as transmission line where appropriate). The transmission line 2 constitutes an electric current loop with a direct-current power supply 3, which outputs a direct current with a predetermined voltage (e.g., 24 V), and a load resistor 4, which has a predetermined resistance value (e.g., 250Ω), connected in series with each other. The measuring instrument 1 converts the physical quantity measured by its sensor to a signal current with an electric current value in the range of, for example, 4 mA to 20 mA, and outputs the signal current to the transmission line 2. An electric current monitoring device 10 of the present invention is connected in series with the transmission line 2 of the measurement system configured as described above and detects the electric current flowing through the transmission line 2.

The electric current monitoring device 10 has two terminals VP and VM for connecting the electric current monitoring device 10 in series with the transmission line 2, and also includes a supply voltage generator 20 for generating a predetermined voltage out of the electric current flowing through the transmission line 2, an electric current detector 30 for detecting an electric current value of the signal current flowing through the transmission line 2, and a radio unit 40 for radio-transmitting the electric current value (electric current data) detected by the electric current detector 30. Specifically, the electric current monitoring device 10 has a circuit configuration shown in FIG. 2.

Between the terminals VP and VM are connected the following elements in parallel with each other: a transistor Q1 through which is passed the signal current flowing in the transmission line 2; a voltage detector 21 for detecting a voltage (voltage drop) between two electrodes (e.g., between source and drain) of the transistor Q1 caused due to the flow of the signal current through the transistor Q1; a reference voltage generator 22 for outputting a predetermined reference voltage; and a voltage comparator/regulator 23 for comparing the reference voltage outputted from the reference voltage generator 22 with the voltage detected by the voltage detector 21 and adjusting the voltage between the two electrodes of the transistor Q1 to a predetermined voltage value.

The transistor Q1 is, for example, a P-channel MOS transistor and has a source connected to the terminal VP and a drain connected to the terminal VM through a shunt resistor R5, described later. The gate of the transistor Q1 is connected with the output (control signal) of an operational amplifier A1 constituting the voltage comparator/regulator 23, as described in detail later. A line connected to the terminal VM through the shunt resistor R5 is referred to as GND line 11 which has a reference potential of 0 V, and a line connected to the terminal VP is referred to as VSUP line 12 which has a potential VSUP.

The voltage detector 21 includes two resistors R1 and R2 connected in series between the VSUP line 12 and the GND line 11. The reference voltage generator 22 includes a resistor R6 and a reference voltage source VREF connected in series between the VSUP line 12 and the GND line 11. The reference voltage source VREF has an anode connected to the GND line and has a cathode connected to the VSUP line 12 via the resistor R6.

The reference voltage source VREF is constituted, for example, by a Zener diode, a bandgap reference or the like. As the reference voltage source VREF of the reference voltage generator 22, a bandgap reference is preferred to a Zener diode because of its higher temperature stability.

The node (detected potential VT) between the resistors R1 and R2 of the voltage detector 21 is connected to the negative input terminal of the operational amplifier A1 constituting the voltage comparator/regulator 23, and the node (reference potential VR) between the resistor R6 and the reference voltage source VREF of the reference voltage generator 22 is connected to the positive input terminal of the operational amplifier A1. Positive and negative power supply terminals for driving the operational amplifier A1 are connected to the VSUP line 12 and the GND line 11, respectively.

When the condition: potential (reference potential VR) of the positive input terminal<potential (detected potential VT) of the negative input terminal, is fulfilled, the potential of the GND line 11 is applied to the gate of the transistor Q1, so that the transistor Q1 is brought to a cutoff state. Thereupon, the drain-source voltage of the transistor Q1 rises, increasing the potential of the VSUP line 12. Since the voltages applied to the resistors R1 and R2 of the voltage detector 21 also rise at this time, the potential (detected potential VT) at the node between the resistors R1 and R2 rises. When the detected potential exceeds the reference potential VR, the output of the operational amplifier A1 is switched to the potential of the VSUP line, whereupon a drain current begins to flow in the transistor Q1. Since the gate-source voltage of the transistor Q1 increases as a result, the drain current of the transistor Q1 increases. The operational amplifier A1 then controls the gate of the transistor Q1 so that the potential (detected potential) at the node between the resistors R1 and R2 of the voltage detector 21 may become equal to the reference potential VR. Thus, the supply voltage generator 20 constitutes a shunt regulator.

The source-drain voltage of the transistor Q1 is determined by the combination of the resistors R1 and R2 of the voltage detector 21 and the reference voltage source VREF. For example, if the resistance values of the resistors R1 and R2 are 400 kΩ and 100 kΩ, respectively, and the breakdown voltage of the reference voltage source VREF is 1.23 V, the potential of the VSUP line 12 is five times the breakdown voltage, namely, 6.15 V. Thus, a desired voltage can be made to appear on the VSUP line 12 by adjusting the resistance ratio of the resistors R1 and R2 of the voltage detector 21.

The resistance values of the resistors R1 and R2 are determined taking account of current consumption as a trade-off. Namely, if the resistors are each constituted by a resistor with high resistance, the power consumption of the circuitry lowers. The reference potential, on the other hand, is constant regardless of the gate-source voltage of the transistor Q1. Accordingly, the resistance value of the resistor R6 should desirably be large in order to reduce the electric current consumption of the circuitry. Specifically, where the resistance values of the resistors R1 and R2 are set so that the potential of the VSUP line may be equal to 6.15 V and the resistor R6 has a resistance of 1 MΩ, the electric current flowing to the reference voltage source VREF is 4.92 µA (=(6.15−1.23)/1×$10^6$).

For the resistor R6, an active element such as a FET or a transistor, or a circuit block such as a current mirror circuit may be used instead of the aforementioned resistor. Also, the transistor Q1 may alternatively be constituted by an N-channel MOS transistor instead of a P-channel MOS transistor, on condition that the input polarities of the operational amplifier A1 are reversed. A PNP transistor or an NPN transistor may also be used as the transistor Q1. Further, where the operational amplifier A1 has sufficient driving capability, the circuitry may be controlled solely by the operational amplifier A1. In this case, the transistor Q1 is unnecessary, making it possible to simplify the circuitry.

The electric current detector 30, on the other hand, includes the shunt resistor R5 connected in series between the terminals VP and VM, and an operational amplifier A2 for detecting and amplifying a voltage drop caused between the two ends of the shunt resistor R5 due to the flow of the signal current. To the shunt resistor R5 flows the sum of electric currents from the radio unit 40, the operational amplifiers A1 and A2, the voltage detector 21 and the reference voltage generator 22, and the drain current of the transistor Q1.

The operational amplifier A2 has a positive input terminal connected to the GND line 11 and has a negative input terminal connected to a resistor R4, which is connected to the output terminal of the operational amplifier A2, as well as to a resistor R3, which is connected to the terminal VM. The positive and negative power supply terminals of the operational amplifier A2 are connected to the VSUP line 12 and the GND line 11, respectively.

The resistors R3 and R4 serve to determine the amplification factor of the operational amplifier A2. Specifically, where the resistors R3 and R4 have resistance values of 100 kΩ and 500 kΩ, respectively, the amplification factor is "5" (=R4/R3=500 kΩ/100 kΩ). If an electric current of 4 mA flows through the shunt resistor R5 from the terminal VP, for example, a voltage drop of 0.2 V occurs across the shunt resistor R5, whereupon a voltage of 1.0 V (=0.2×5) appears at the output terminal of the operational amplifier A2. If, on the other hand, an electric current of 20 mA flows through the shunt resistor R5 from the terminal VP, a voltage drop of 1.0 V occurs across the shunt resistor R5, whereupon a voltage of 5.0 V (=1.0×5) appears at the output terminal of the operational amplifier A2.

Since the electric current also flows to the resistors R3 and R4 of the electric current detector 30, the electric current detection value contains error in some degree. However, the error can be minimized by appropriately setting the resistance values of the resistors R3, R4 and R5. The electric current monitoring device of the present invention therefore presents no problem in practical use. For example, where the electric current detector 30 detects an electric current of 4 mA, a voltage drop of 0.2 V occurs across the resistor R5 as stated above, and accordingly, a voltage drop of 0.2 V occurs across the resistor R3. Provided the resistor R3 has a resistance of 100 kΩ, an electric current (error current) of 2 μA flows through the resistor R3. The error current accounts for 0.05% of the measured electric current 4 mA. In the case of industrial measuring instruments in general, an error of 0.1% is permissible, and therefore, a measurement error of 0.05% presents no practical problem.

Also, the error current always shows a fixed proportion to the measured electric current. Namely, provided the detected electric current value is I, the error current Ierr is given by Ierr=I×(R5/R3). Specifically, if the detected electric current I is 8 mA, the error current Ierr is 4 μA. If the detected electric current I is 12 mA, the error current Ierr is 6 μA, and if the detected electric current I is 20 mA, the error current Ierr is 10 μA. Thus, in the electric current monitoring device of the present invention, it is known beforehand that the detected electric current contains an error current that accounts for a fixed proportion of the detected electric current, and it is therefore possible to correct the electric current data outputted from the electric current detector 30 by an amount corresponding to the error current.

The electric current data outputted from the electric current detector 30 is supplied to the subsequent radio unit 40. The radio unit 40 has the function of modulating the input analog current signal and then transmitting the detected electric current data at all times as a high-frequency signal with a predetermined frequency. A receiver, not shown, receives the electric current data from the radio unit 40 and performs a predetermined process on the received data.

Specifically, a hybridized radio module is used for the radio unit 40. The radio module as the radio unit 40 may be of any type and may employ any modulation scheme insofar as the module can receive the electric current data (e.g., direct-current voltage of 1 V to 5 V) outputted from the electric current detector 30 in the form of analog quantity and radio-transmit the electric current data after performing a specified modulation (amplitude modulation, frequency modulation, phase modulation, spread spectrum modulation, etc.) based on the magnitude of the analog quantity indicated by the received electric current data. In brief, any type of radio module may be used as the radio unit 40 insofar as it is capable of radio transmission of the electric current data detected by the electric current detector 30. The internal configuration of the radio unit 40 does not constitute the essential part of the present invention, and therefore, description thereof is omitted.

In plants in general, a plurality of apparatuses as targets of measurement are arranged as mentioned above. In the case of connecting the electric current monitoring devices of the present invention to such apparatuses, the individual radio units 40 and a receiver (not shown) for receiving radio signals from the radio units 40 may adopt an access scheme such as a frequency division multiple access (FDMA), time division multiple access (TDMA) or code division multiple access (CDMA) in order that the radio signals transmitted from the respective radio units 40 may not interfere with one another.

The supply voltage generator 20, the electric current detector 30 and the radio unit 40 need to be designed so that the total electric current consumption of these elements may not exceed a minimum value (in the above instance, 4 mA) of the signal current flowing through the transmission line 2.

Thus, the electric current monitoring device of the first embodiment of the present invention, constructed as described above, comprises the electric current detector 30 inserted in the transmission line 2 and adapted to measure the electric current value of the signal current flowing through the transmission line 2, the transistor Q1 inserted in the transmission line 2 such that the internal resistance between its source and drain, for example, varies in accordance with the level of the control signal, the voltage detector 21 connected to the source and drain of the transistor Q1 and adapted to detect the value of a voltage caused between these electrodes due to the flow of the signal current, the reference voltage generator 22 connected to the source and drain of the transistor Q1 and adapted to output the predetermined reference voltage value, and the voltage comparator/regulator 23 for comparing the reference voltage value outputted from the reference voltage generator 22 with the voltage value detected by the voltage detector 21 to adjust the voltage of the control signal applied to the gate of the transistor Q1, thereby adjusting the source-drain voltage of the transistor Q1 to the predetermined voltage value. The electric current detector 30 as well as the radio unit 40, which is adapted to radio-transmit the electric current data detected by the electric current detector 30, are driven by the voltage developed between the source and drain of the transistor Q1. It is therefore unnecessary to use an external power supply such as a power supply unit or a battery, and a power supply line associated therewith, as well as a transmission line for transmitting the detected electric current data. Accordingly, the present invention can provide an electric current monitoring device that neither incurs the cost of laying a power supply line and a wired transmission path nor requires the replacement of battery.

Figure 3:
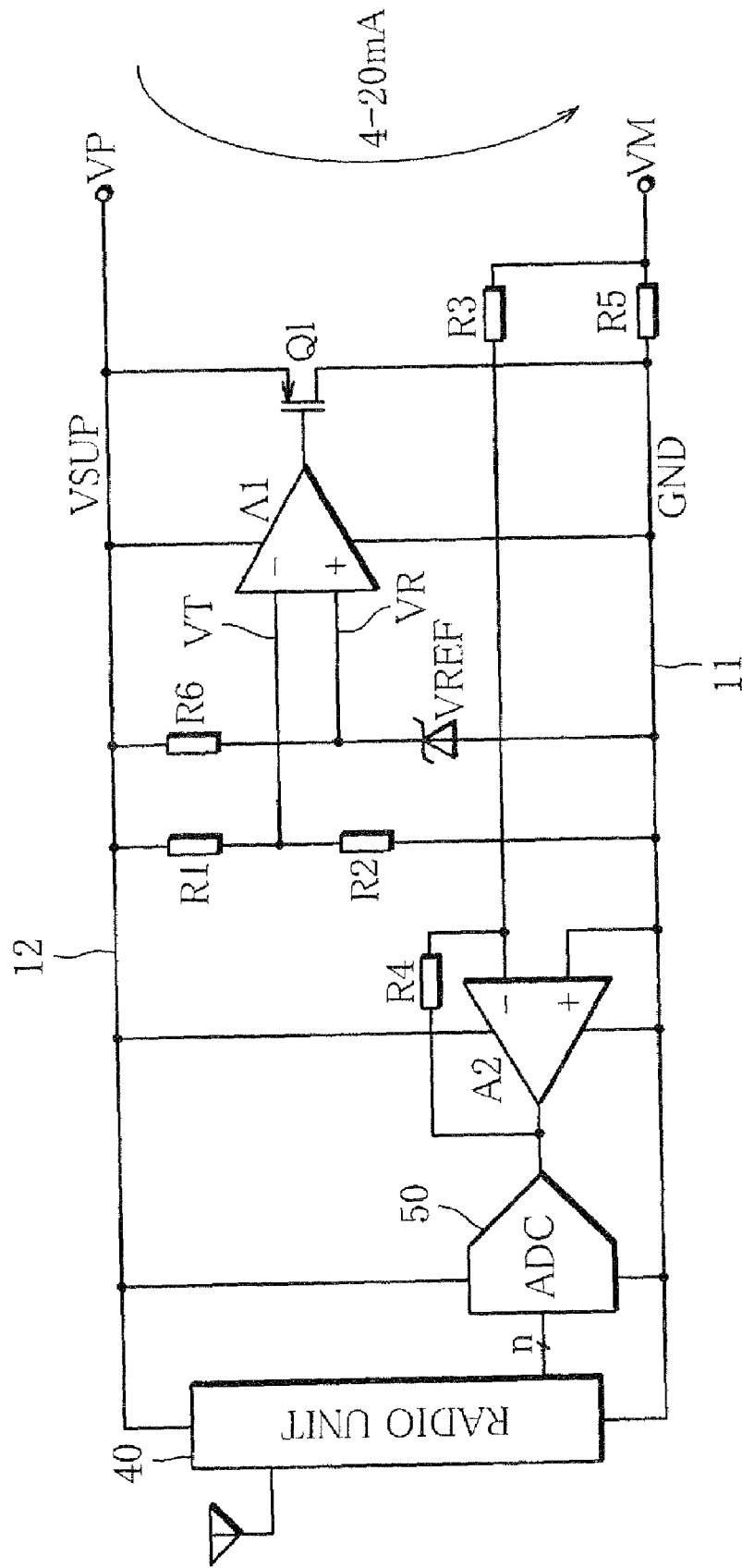
FIG. 3 is a circuit diagram showing a principal part of an electric current monitoring device according to a second embodiment of the present invention.

An electric current monitoring device according to a second embodiment of the present invention will be now described with reference to FIG. 3. In the figure, the same reference signs as those used in the first embodiment denote elements having the same functions, and description of such elements is omitted. The electric current monitoring device of the second embodiment differs from that of the first embodiment in that the analog voltage value (current data) outputted from the electric current detector 30 is converted to n-bit digital data by an A/D converter 50, the n-bit digital data from the A/D converter 50 being sent to the radio unit 40. Positive and negative power supply terminals for driving the A/D converter 50 are connected to the VSUP line 12 and the GND line 11, respectively.

The electric current monitoring device of the second embodiment permits the use of a radio module, as the radio unit 40, that admits only digital data as its input signal, and therefore, has higher versatility. For example, a radio transmission module based on Bluetooth, ZigBee or the like can be applied to the electric current monitoring device of the second embodiment, making it easy to implement the present invention. Also, in the second embodiment, the detected electric current data is converted to digital data. Accordingly, in cases where a data receiving side, not shown, is configured to process digital data, it is unnecessary for the receiving side to convert the received analog data to digital data and the electric current data can be presented in a form best suited for the data processing by, for example, a computer.

Figure 4:
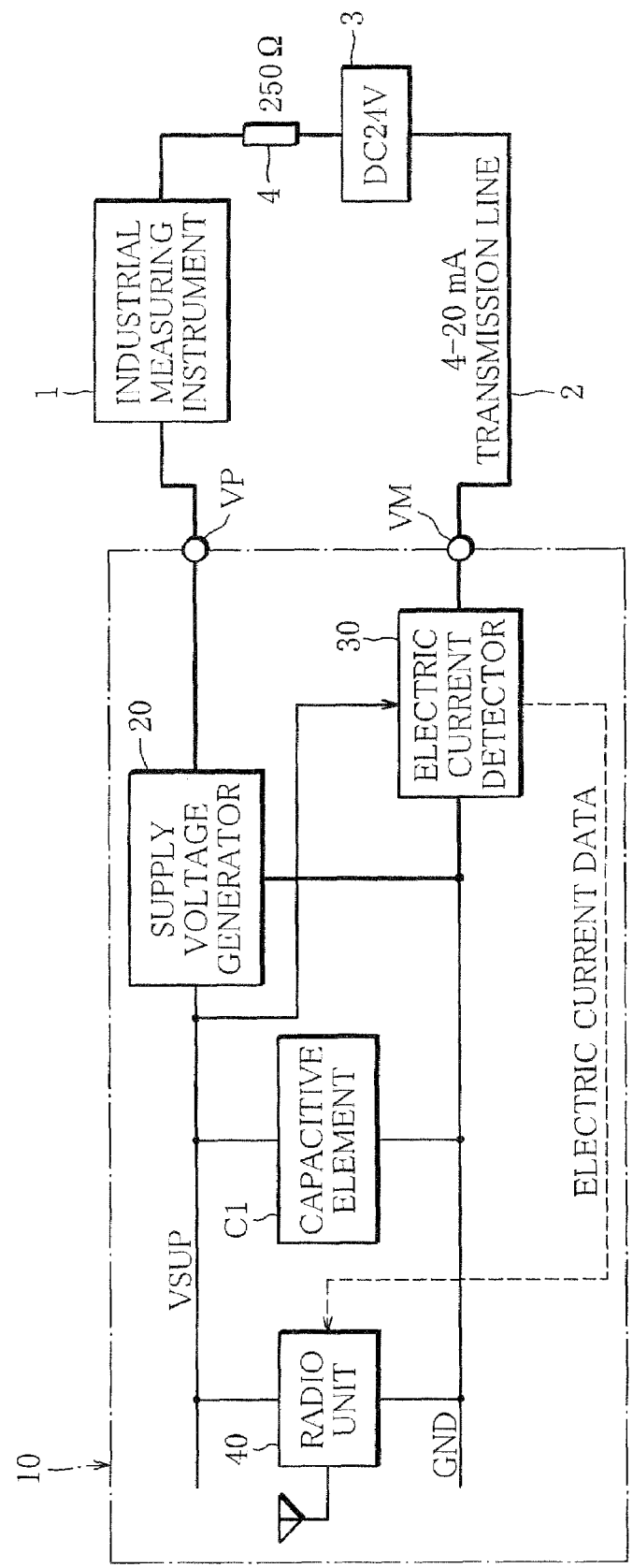
FIG. 4 is a schematic block diagram of an electric current monitoring device according to a third embodiment of the present invention.
Figure 5:
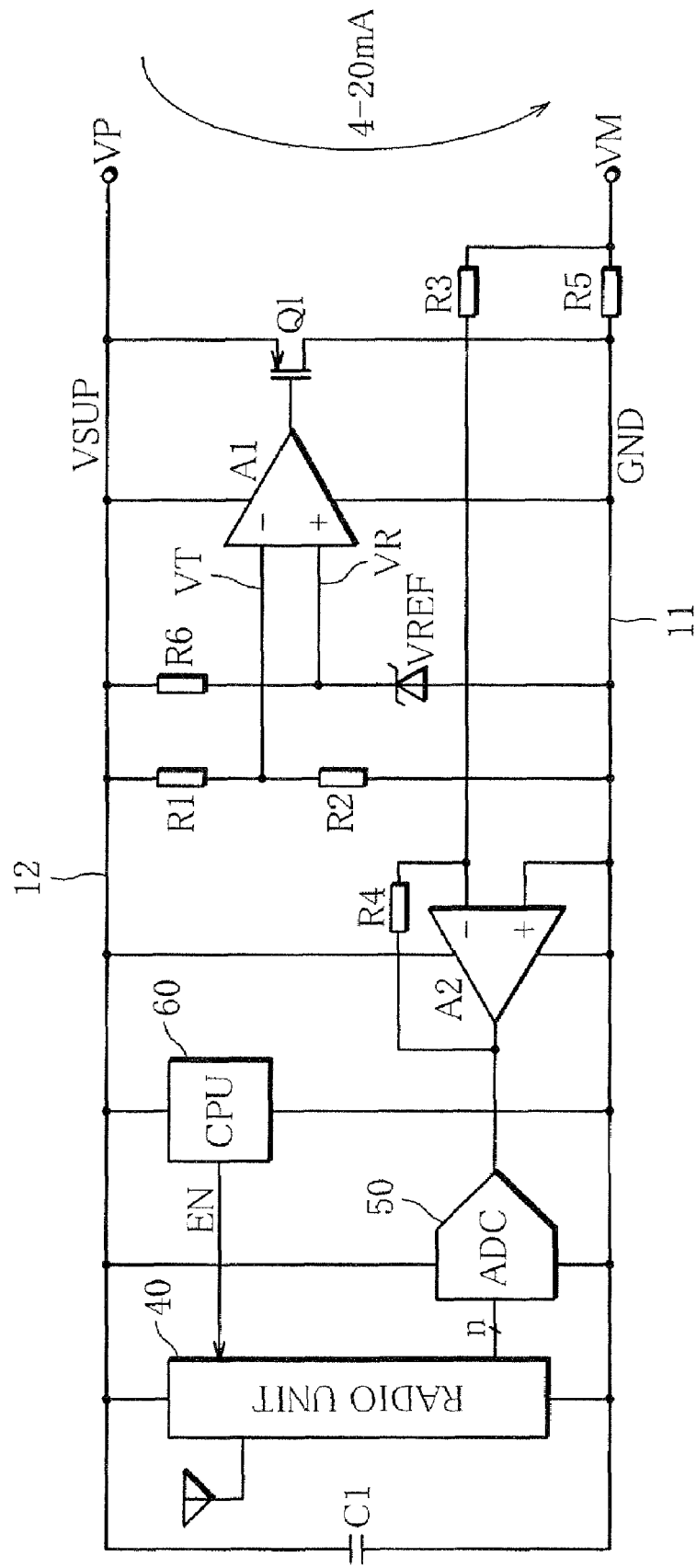
FIG. 5 is a circuit diagram of a principal part of the electric current monitoring device shown in FIG. 4.

An electric current monitoring device according to a third embodiment of the present invention will be now described with reference to FIGS. 4 and 5. In the figures, the same reference signs as those used in the first and second embodiments denote elements having the same functions, and description of such elements is omitted. The electric current monitoring device of the third embodiment differs from those of the first and second embodiments in that a capacitor C1 (capacitive element) is connected between the VSUP and GND lines 12 and 11, and that a CPU 60 is provided for controlling the operations of the radio unit 40, the A/D converter 50, the supply voltage generator 20 and the electric current detector 30. The CPU 60 controls, for example, a control terminal EN of the radio unit 40 to cause the radio unit 40 to transmit data at predetermined intervals of time.

For the capacitor C1, an electric double-layer capacitor or a small-capacity secondary cell is used. While the data transmission from the radio unit 40 is stopped, the capacitor C1 stores a surplus charge (current), and when the radio unit 40 is transmitting data, the capacitor C1 releases the stored charge to be added to the signal current flowing in the transmission line 2, thus serving as an electric current source for making up for the deficiency of electric current required by the radio unit 40.

Specifically, the electric current monitoring device 10 is configured so that when the data transmission from the radio unit 40 is finished, the voltage across the capacitor C1, that is, the voltage (Qmin/C) of the VSUP line 12, may not drop below a minimum driving voltage of the circuit elements (supply voltage generator 20, electric current detector 30, radio unit 40) of the electric current monitoring device 10. Provided the electrostatic capacity of the capacitor C1 (or the capacity of the secondary cell) is C, the maximum charge that can be stored in the capacitor C1 while the data transmission from the radio unit 40 is stopped is Qmax, and the charge remaining in the capacitor C1 when the data transmission from the radio unit 40 is finished is Qmin, the electrostatic capacity C of the capacitor C1 and the transmission interval may be set so that the maximum charge Qmax can be stored in the capacitor C1 while the data transmission from the radio unit 40 is stopped.

Thus, in the electric current monitoring device of the third embodiment, the radio unit 40 is controlled by the CPU 60 so as to operate intermittently. The radio unit 40 can therefore use the charge (electric current) that was stored in the capacitor C1 during the stoppage of the radio unit 40. Namely, the charge (electric current) stored in the capacitor C1 can be used as an electric current source, besides the electric current flowing in the transmission line 2. Accordingly, in the third embodiment, the transmit power with which the radio unit 40 intermittently transmits data can be increased, compared with the foregoing embodiments in which the electric current data is transmitted at all times, making it possible to improve the quality of radio transmission and also to enlarge the transmission distance.

Figure 6:
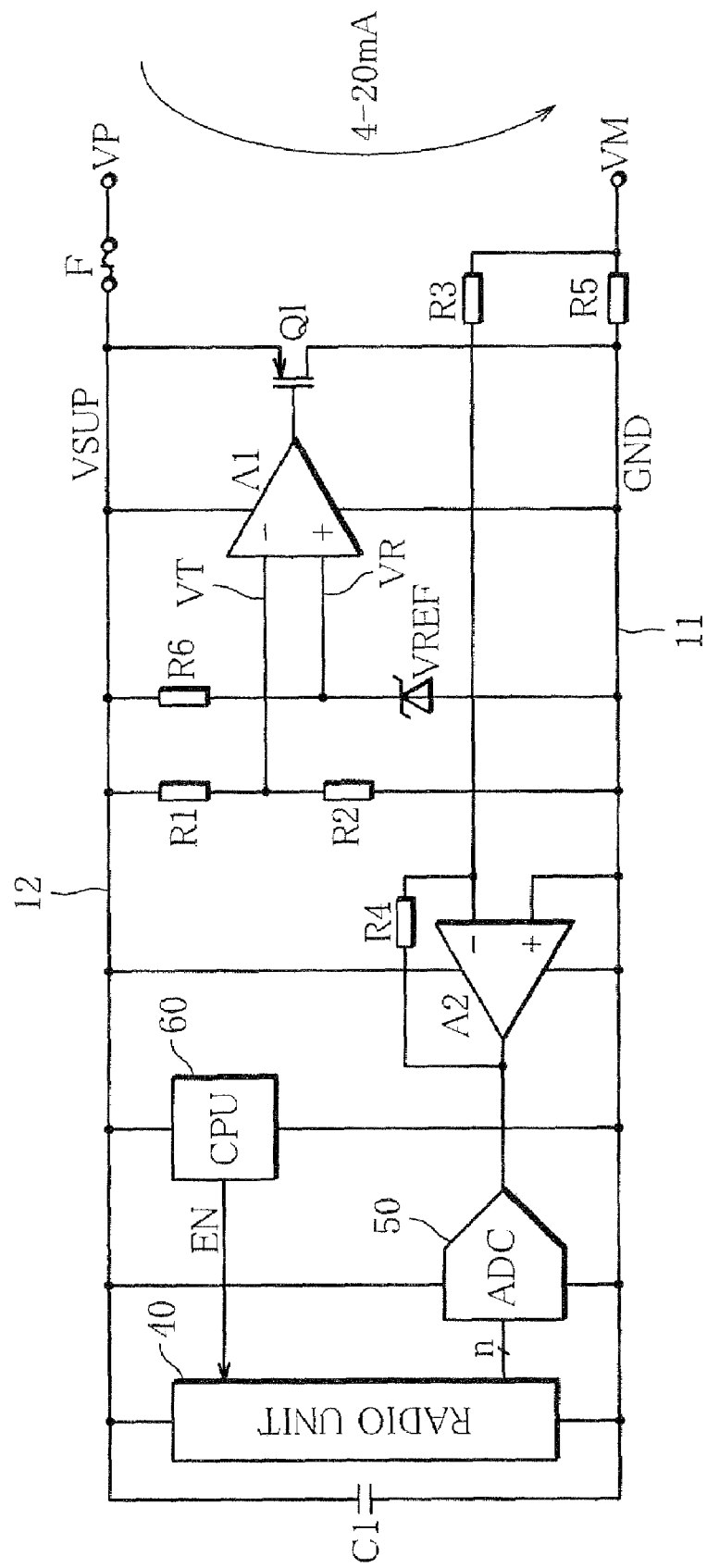
FIG. 6 is a circuit diagram showing a principal part of an electric current monitoring device according to a modification of the third embodiment.

FIG. 6 shows a modification of the electric current monitoring device according to the third embodiment, wherein a fuse F is connected in series between the terminal VP and the VSUP line, for opening the circuit when an overcurrent flows. Usually, the measuring instrument 1, the direct-current power supply 3 and the load resistor 4 are connected between the terminals VP and VM. If these elements are erroneously connected, for example, if the measuring instrument 1 and the load resistor 4 are not connected and thus the direct-current power supply 3 is directly connected between the terminals VP and VM, an excessive current possibly flows between the source and drain of the transistor Q1. When the worst comes to the worst, the transistor Q1 is broken. Preferably, therefore, the fuse F for cutting off the inflow of overcurrent is connected between the terminal VP and the VSUP line, as in the modification, to protect the transistor Q1.

Instead of using the fuse F, an overcurrent protection circuit (not shown) may of course be provided which disconnects the gate of the transistor Q1 from the output terminal of the operational amplifier A1 upon detection of an overcurrent so that the electric current flowing from the terminal VP to the terminal VM may not become excessive. Needless to say, the fuse or the overcurrent protection circuit may be used in the electric current monitoring devices of the first and second embodiments.

Although not shown, peripheral elements of the CPU 60 that are necessary for the intermittent data transmission, such as a timer or counter circuit and a memory for storing programs, may also be connected to the VSUP line 12 and the GND line 11 to be supplied with power.

In the third embodiment and the modification thereof, the intermittent data transmission of the radio unit 40 is controlled (EN control) by the CPU 60. Alternatively, the EN control of the radio unit 40 may be executed at predetermined intervals by using a circuit comprised of discrete components, such as a multivibrator circuit, for example. Also in this case, the electrostatic capacity C of the capacitor C1 and the transmission interval are adjusted so that the voltage (Qmin/C) of the VSUP line 12 may not drop below the minimum driving voltage of the circuit elements (supply voltage generator 20, electric current detector 30, radio unit 40) of the electric current monitoring device 10, as stated above.

Figure 7:
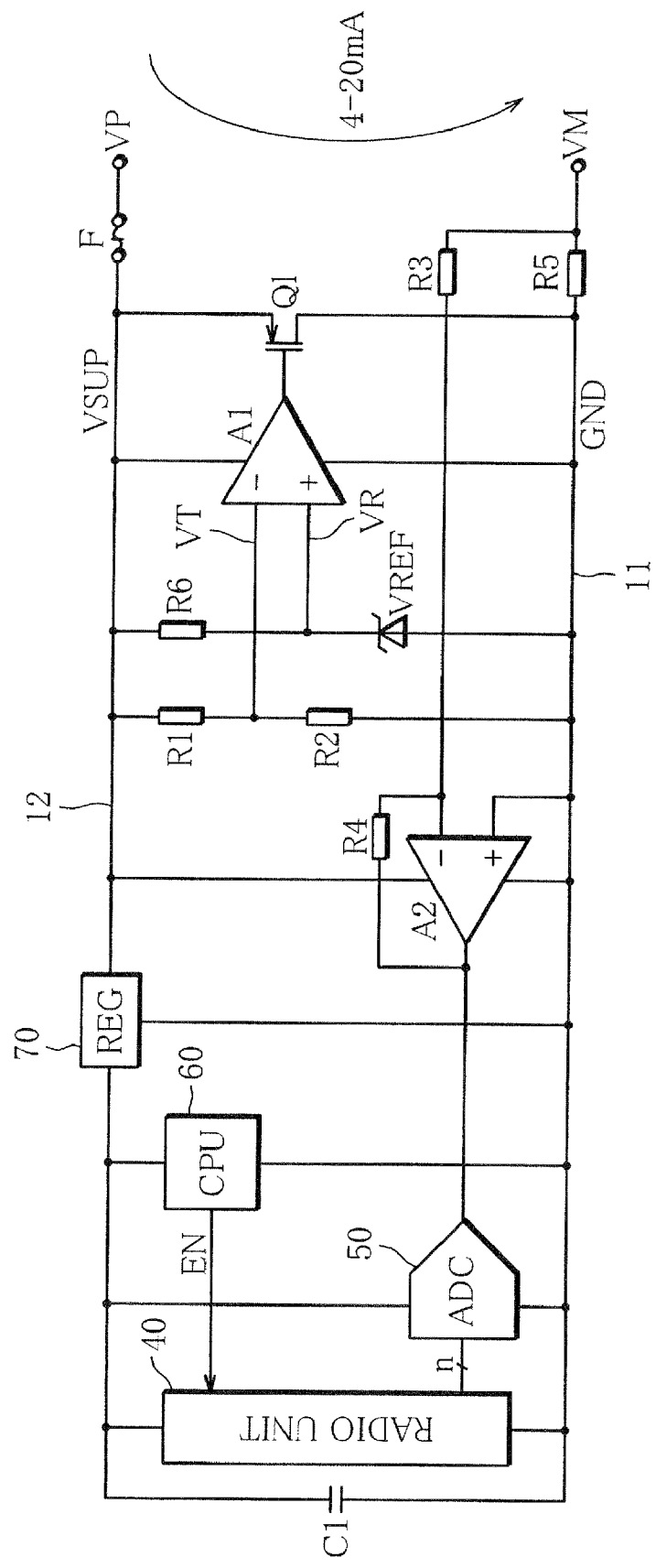
FIG. 7 is a circuit diagram showing a principal part of an electric current monitoring device according to a fourth embodiment of the present invention.

An electric current monitoring device according to a fourth embodiment of the present invention will be now described with reference to FIG. 7. In the figure, the same reference signs as those used in the first to third embodiments denote elements having the same functions, and description of such elements is omitted. The electric current monitoring device of the fourth embodiment differs from those of the first to third embodiments in that a power supply for supplying power to digital circuits of the electric current monitoring device is provided separately from the power supply for supplying power to analog circuits of the monitoring device. Specifically, the supply voltage generator 20 and the electric current detector 30, which are analog circuits, are supplied with power from the VSUP and GND lines 12 and 11, whereas the radio unit 40, the A/D converter 50 and the CPU 60 are supplied with power outputted from a regulator 70 which converts the voltage between the VSUP and GND lines 12 and 11 to a predetermined voltage.

In the electric current monitoring device of the fourth embodiment, the power supply for the analog section is separate from the power supply for the digital section, and accordingly, it is possible to prevent noise superposed on the power supply line due to the operation of the digital circuits from adversely affecting the power supply line (VSUP line 12) for the analog section. Also, according to the fourth embodiment, the operating voltage of the analog section and that of the digital section can be set to different voltages, thus expanding the freedom of design.

Figure 8:
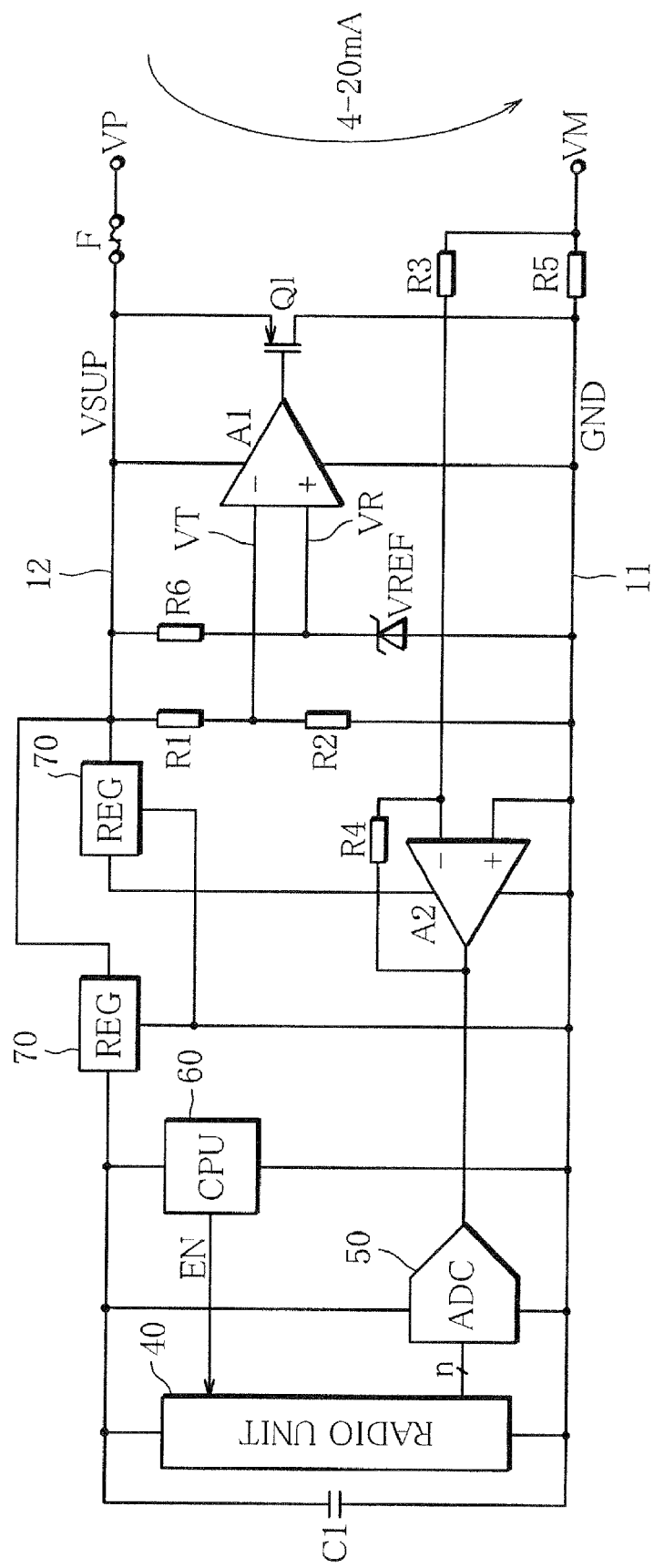
FIG. 8 is a circuit diagram showing a principal part of an electric current monitoring device according to a modification of the fourth embodiment.

In cases where the elements of the digital section operate at different voltages, the electric current monitoring device of the fourth embodiment may be modified as shown in FIG. 8, wherein multiple regulators 70 are connected between the VSUP and GND lines 12 and 11 so as to output respective different voltages. By configuring the electric current monitoring device as illustrated, it is possible to implement the present invention even in cases where the components operate at different voltages.

An electric current monitoring device according to a fifth embodiment of the present invention will be now described with reference to FIG. 9. In the figure, the same reference signs as those used in the first to fourth embodiments denote elements having the same functions, and description of such elements is omitted. The electric current monitoring device of the fifth embodiment differs from those of the first to fourth embodiments in that a series regulator is used in place of the shunt regulator.

Figure 9:
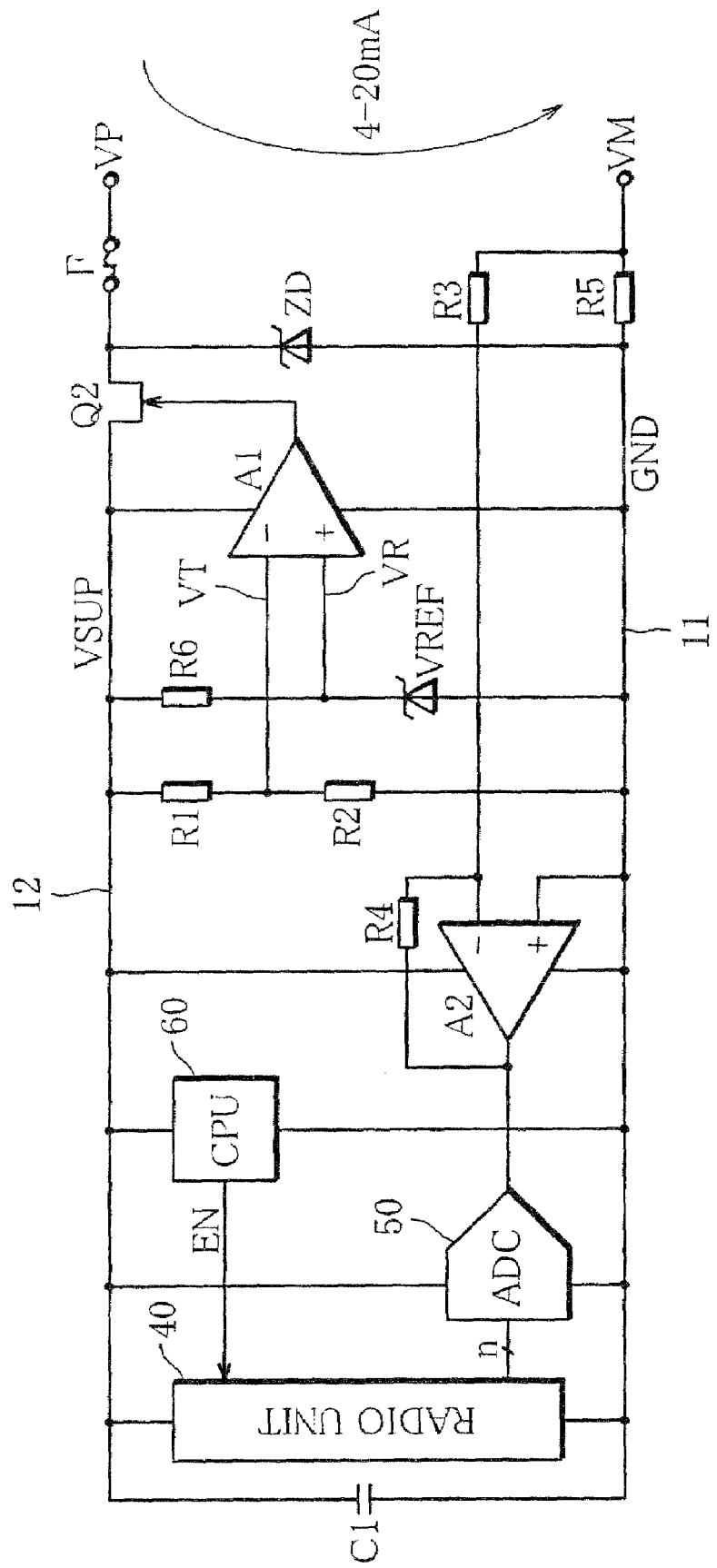
FIG. 9 is a circuit diagram showing a principal part of an electric current monitoring device according to a fifth embodiment of the present invention.

Specifically, in the fifth embodiment, a Zener diode ZD is connected between the VSUP and GND lines 12 and 11, as shown in FIG. 9, so as to be reversely biased. Further, an N-channel J-FET (transistor Q2) is connected between the cathode of the Zener diode ZD and the positive power supply line (VSUP line 12) for the elements constituting the electric current monitoring device, namely, the supply voltage generator 20, the electric current detector 30, the radio unit 40, the A/D converter and the CPU 60. The output of the operational amplifier A1 of the supply voltage generator 20 is connected to the gate of the J-FET (transistor Q2).

In the electric current monitoring device of the fifth embodiment configured as above, when the voltage (detected voltage VT) of the negative input terminal of the operational amplifier A1 is higher than the potential (reference potential VP) of the positive input terminal, that is, when the voltage of the VSUP line is higher than the predetermined voltage, the gate terminal voltage of the transistor Q2 drops, decreasing the drain current. Thus, the voltage VSUP decreases, whereupon the potential (detected voltage VT) at the node between the resistors R1 and R2 constituting the voltage detector 21 lowers in like manner. Consequently, the voltage of the negative input terminal of the operational amplifier A1, which is determined by the ratio of resistance between the resistors R1 and R2, lowers.

On the other hand, when the voltage (detected voltage VT) of the negative input terminal of the operational amplifier A1 is lower than the potential (reference potential VR) of the positive input terminal, the gate terminal voltage of the transistor Q2 rises, increasing the drain current. Thus, the voltage VSUP increases, whereupon the potential (detected voltage VT) at the node between the resistors R1 and R2 constituting the voltage detector 21 also rises. As a result, the voltage of the negative input terminal of the operational amplifier A1, which is determined by the ratio of resistance between the resistors R1 and R2, rises. The above sequence of operations, namely, feedback action, serves to keep the voltage of the VSUP line 12 at a fixed level.

The electric current flowing into the electric current monitoring device is based on the signal current flowing through the transmission line 2. Thus, an electric current in excess of the electric current that is consumed by the individual elements constituting the electric current monitoring device is nothing but a surplus current and is unnecessary. In other words, no signal current flows from the measuring instrument 1 to the transmission line 2 unless a path is provided for passing the surplus current. The Zener diode ZD serves as a path for passing the surplus current.

Figure 10:
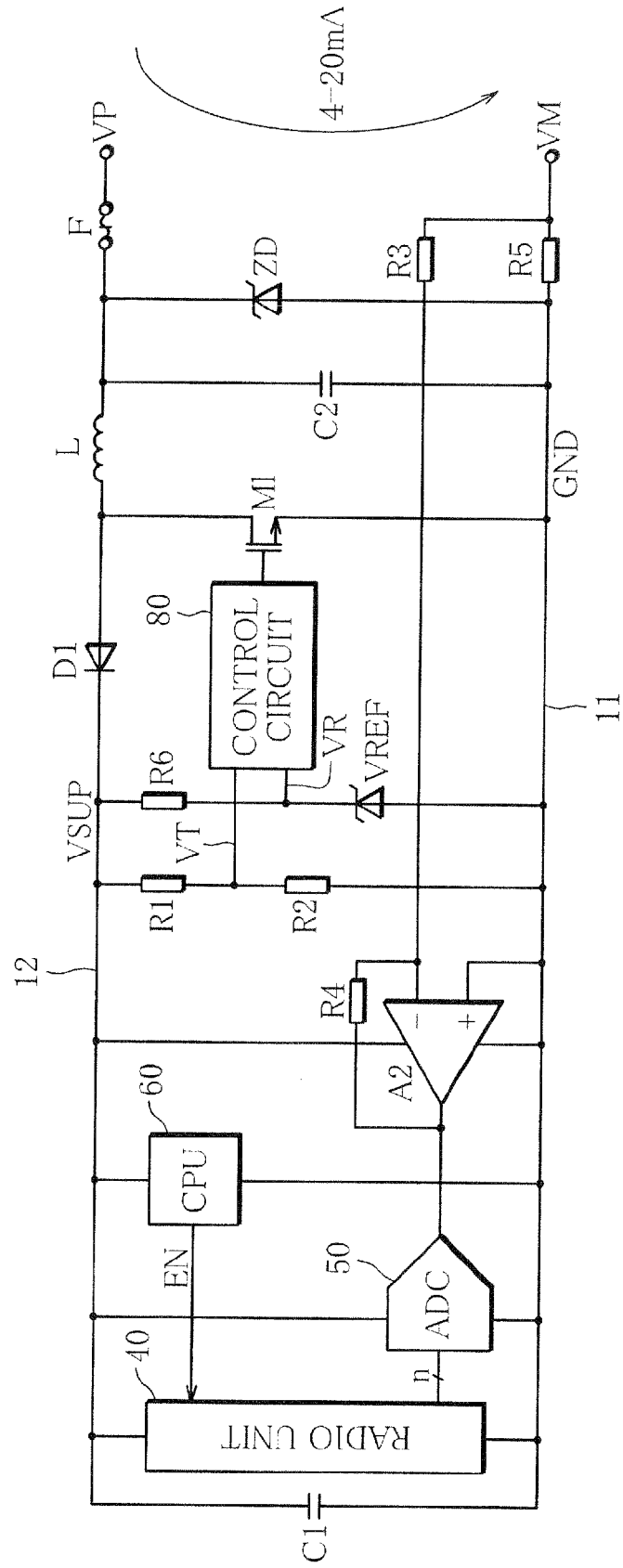
FIG. 10 is a circuit diagram showing a principal part of an electric current monitoring device according to a sixth embodiment of the present invention.

An electric current monitoring device according to a sixth embodiment of the present invention will be now described with reference to FIG. 10. In the figure, the same reference signs as those used in the first to fifth embodiments denote elements having the same functions, and description of such elements is omitted. The electric current monitoring device of the sixth embodiment differs from those of the first to fifth embodiments in that a DC-DC converter is used in place of the series regulator or the shunt regulator.

The DC-DC converter is constructed in the manner described below. A Zener diode ZD is connected between the terminal VP and the GND line 11 via the fuse F so as to be reversely biased, and a smoothing capacitor C2 is connected in parallel with the Zener diode ZD. An inductor L and a diode D1 are connected in series between the cathode of the Zener diode ZD and the positive power supply line (VSUP line 12) for the elements constituting the electric current monitoring device, namely, the supply voltage generator 20, the electric current detector 30, the radio unit 40, the A/D converter and the CPU 60. The diode D1 has an anode connected to the inductor L and a cathode connected to the VSUP line 12. To the node between the inductor L and the anode of the diode D1 is connected the source of a MOSFET (M1), the drain of which is connected to the GND line 11. The node between the resistors R1 and R2 constituting the voltage detector 21 and the node between the resistor R6 and the reference voltage source VREF of the reference voltage generator 22 are connected to a control circuit 80 for controlling the DC-DC converter. The control circuit 80 provides an output to the gate of the MOSFET (M1) to switch on and off the MOSFET (M1) so that the voltage VSUP detected by the voltage detector 21 may become equal to a predetermined voltage based on the reference voltage outputted from the reference voltage generator 22. As a result of the switching of the MOSFET (M1), the voltage of the VSUP line 12 is generated as a sum of the counter electromotive force developed in the inductor L and the voltage across the smoothing capacitor C2. Namely, the voltage of the VSUP line 12 can be set to a value higher than the voltage between the terminals VP and VM.

Thus, in the electric current monitoring device of the sixth embodiment configured as described above, the voltage VSUP can be set higher than the voltage between the terminals VP and VM. Accordingly, even in cases where the electric current detector 30, the radio unit 40, the A/D converter 50 and the CPU 60 require an operating voltage higher than the voltage between the terminals VP and VM, the electric current monitoring device of this embodiment can detect the electric current flowing in the transmission line 2. The regulator used in the fourth embodiment may of course be employed in the sixth embodiment such that the voltage raised by the DC-DC converter is subsequently lowered by the regulator to obtain a desired voltage.

Figure 11:
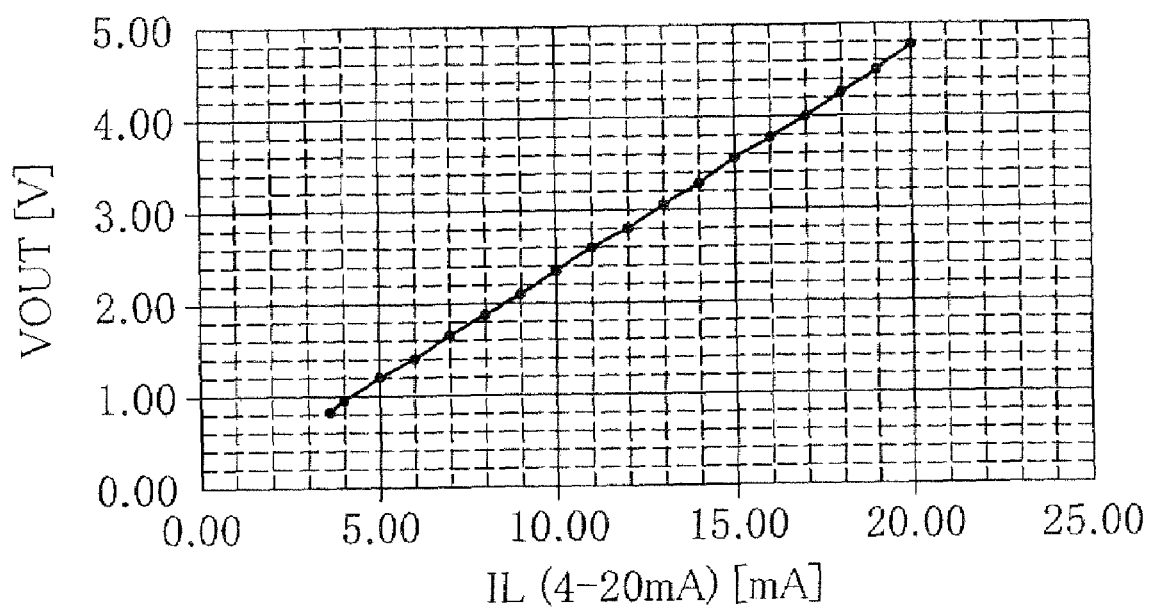
FIG. 11 is a graph showing the results of an evaluation test conducted on the electric current monitoring device of the present invention.

FIG. 11 is a graph showing the results of an evaluation test conducted to ascertain whether the electric current monitoring device of the present invention operates properly, wherein the output voltage of the operational amplifier A2 was measured with the electric current monitoring device inserted in the transmission line 2 carrying an electric current of 4 mA to 20 mA. In the graph, the horizontal axis indicates the electric current (in mA) flowing through the transmission line 2, and the vertical axis indicates the output (in V) of the operational amplifier A2. The graph reveals that the operational amplifier A2 outputs a voltage of 1 V when the electric current flowing in the transmission line 2 is 4 mA and outputs a voltage of 5 V when the electric current flowing in the transmission line 2 is 20 mA. As shown in the graph, the output of the operational amplifier A2 changes linearly with respect to the electric current flowing in the transmission line 2, verifying that the electric current monitoring device of the present invention has satisfactory linearity.

The output voltage of the operational amplifier A2 is determined by the ratio of resistance between the resistors R3 and R4 as mentioned above, and accordingly, by varying the ratio of resistance between the resistors R3 and R4, it is possible to cause the operational amplifier A2 to output a voltage within a desired range other than the above voltage range.

Thus, with the electric current monitoring device of the present invention, the output voltage value of the operational amplifier A2 can be radio-transmitted by the radio unit 40. A liquid crystal display panel, not shown, may be additionally provided in the electric current monitoring device of the present invention to display the value of the electric current flowing in the transmission line 2 without the need for an external power supply.

Although the aforementioned electric current monitoring devices of the present invention use a shunt regulator, a series regulator or a DC-DC converter, any type of regulator may be used insofar as the power for operating the electric current monitoring device can be internally generated by using the signal current outputted from the measuring instrument. Also, the construction of the regulators is not limited to those illustrated in the circuits explained above.

While the electric current monitoring devices according to the present invention have been described, it is to be noted that the present invention is not limited to the foregoing embodiments and may be modified in various ways without departing from the spirit of the invention.

The invention claimed is:

1. An electric current monitoring device arranged for measuring an electric current value of a signal current outputted to a two-wire transmission line by a measuring instrument that converts a physical quantity measured thereby to the signal current, comprising:

an electric current detector inserted in the transmission line, for measuring an electric current value of the signal current outputted to the transmission line;

a radio unit for radio-transmitting the electric current value measured by the electric current detector; and a supply voltage generator inserted in the transmission line, for outputting a voltage generated due to flow of the signal current through the transmission line;

wherein the supply voltage generator includes:

a transistor inserted in the transmission line and allowing the signal current to pass therethrough, a voltage detector connected to two electrodes of the transistor that is inserted in the transmission line, for detecting a voltage value of a voltage generated between the two electrodes due to flow of the signal current therebetween, a reference voltage generator connected to the two electrodes of the transistor, for outputting a predetermined reference voltage value, and a voltage comparator/regulator for comparing the reference voltage value outputted from the reference voltage generator with the voltage value detected by the voltage detector, and varying an internal resistance of the transistor to adjust the voltage between the two electrodes of the transistor to a predetermined voltage value, wherein the electric current detector and the radio unit are driven by the voltage outputted from the supply voltage generator.

2. The electric current monitoring device according to claim 1, wherein the radio unit transmits the measured electric current value intermittently at predetermined intervals and includes a capacitive element for storing a charge derived from the supply voltage generator while the transmission of the radio unit is stopped, and for releasing the stored charge to make up for an electric current needed by the radio unit while the transmission of the radio unit is being performed.

* * * * *